(12) United States Patent
Doshida et al.

(10) Patent No.: US 7,656,073 B2
(45) Date of Patent: Feb. 2, 2010

(54) DRIVING DEVICE

(75) Inventors: Yutaka Doshida, Gunma (JP); Hiroshi Kishi, Gunma (JP); Masafumi Tsukada, Gunma (JP); Katsuei Ishida, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 470 days.

(21) Appl. No.: 11/271,676

(22) Filed: Nov. 10, 2005

(65) Prior Publication Data

US 2006/0119218 A1    Jun. 8, 2006

(30) Foreign Application Priority Data

Nov. 10, 2004    (JP) .............................. 2004-327112

(51) Int. Cl.
*H01L 41/08*    (2006.01)
(52) U.S. Cl. ..................................... 310/330
(58) Field of Classification Search ................. 310/330, 310/324, 332, 317, 323, 365, 366, 328, 323.17; 359/824; *H01L 41/08, 41/09*
See application file for complete search history.

(56) References Cited

U.S. PATENT DOCUMENTS 7,129,621 B2 * 10/2006 Sakano et al. ........... 310/323.01
7,305,685 B2 * 12/2007 Rumpf et al. .......... 310/323.17

FOREIGN PATENT DOCUMENTS

| JP | 4-69070 | 3/1992 |
| JP | 7-298654 | 11/1995 |
| JP | 08-168278 A | 6/1996 |
| JP | 08-207755 | 8/1996 |
| JP | 8-207755 | * 8/1996 |
| JP | 09-037571 | 2/1997 |
| JP | 10-144976 | 5/1998 |

* cited by examiner

*Primary Examiner*—Walter Benson
*Assistant Examiner*—Karen B Addison
(74) *Attorney, Agent, or Firm*—Law Office of Katsuhiro Arai

(57) ABSTRACT

A driving device, small in size and light in weight, is to stabilize the position of a surface-deforming element while reducing the effect of gravity thus enabling stable transfer and positioning. The driving device is structured to hold a movable member integrated with a piezoelectric vibrator and a lens by a shaft provided at a tip of a spring extended from an inner surface to center of a passageway. The shaft extends through an opening formed in a protrusion of the movable member. By a tensile force of the spring, the movable member at its outer periphery is pulled radially and held. When applying a voltage with a waveform changing sharply to the piezoelectric vibrator, the movable member flexes maximally upward or downward to have a reduced diameter and an increasing acceleration thereby making a movement. Then, when a frictional force increases, the protrusion is held at a point where the movable member moves. Because of being held by a tensile force, the effect of gravity decreases and hence the movable member is stabilized in position relative to a direction of transfer.

18 Claims, 17 Drawing Sheets

[Fig. 1]
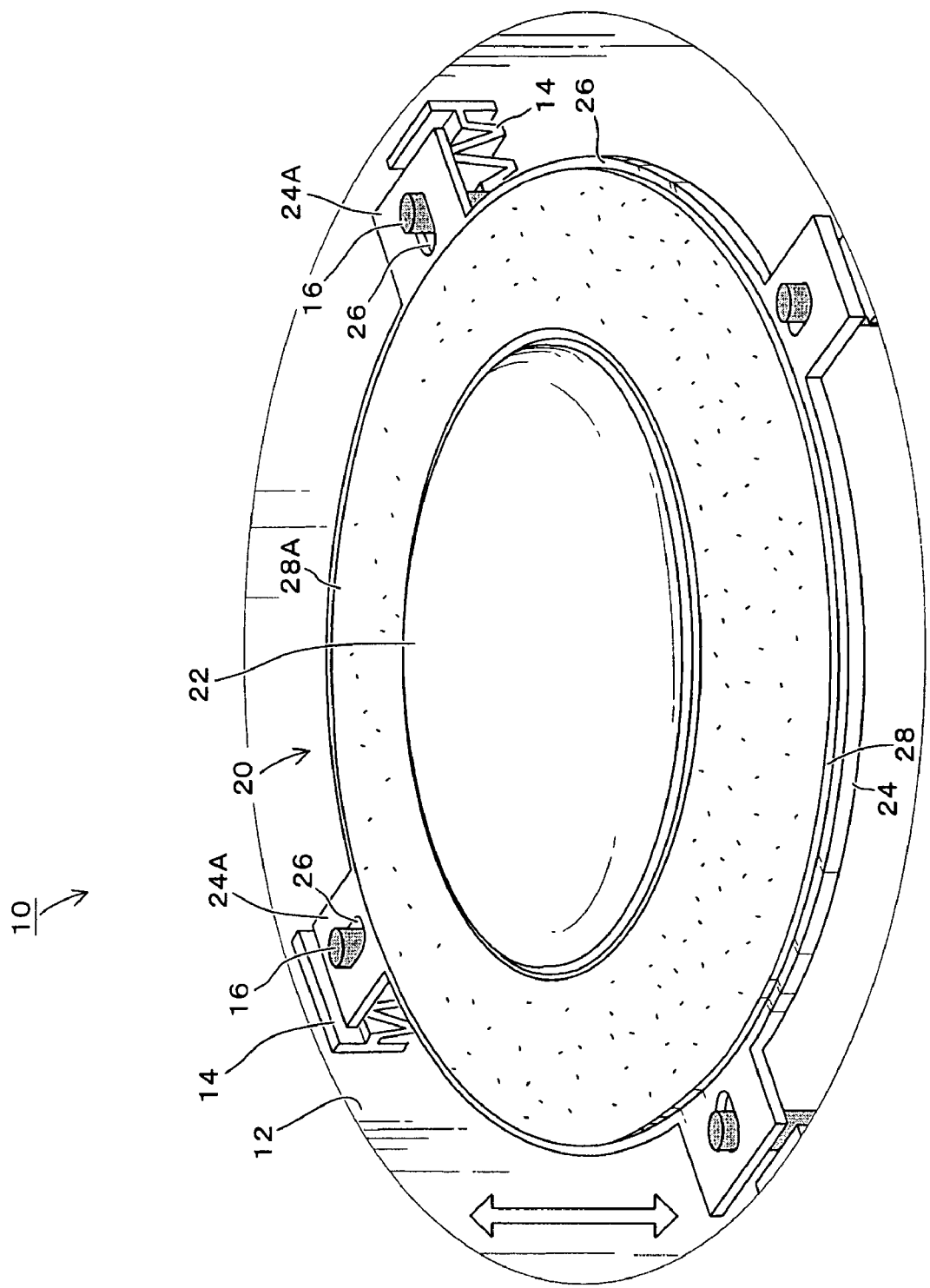

[Fig. 2]
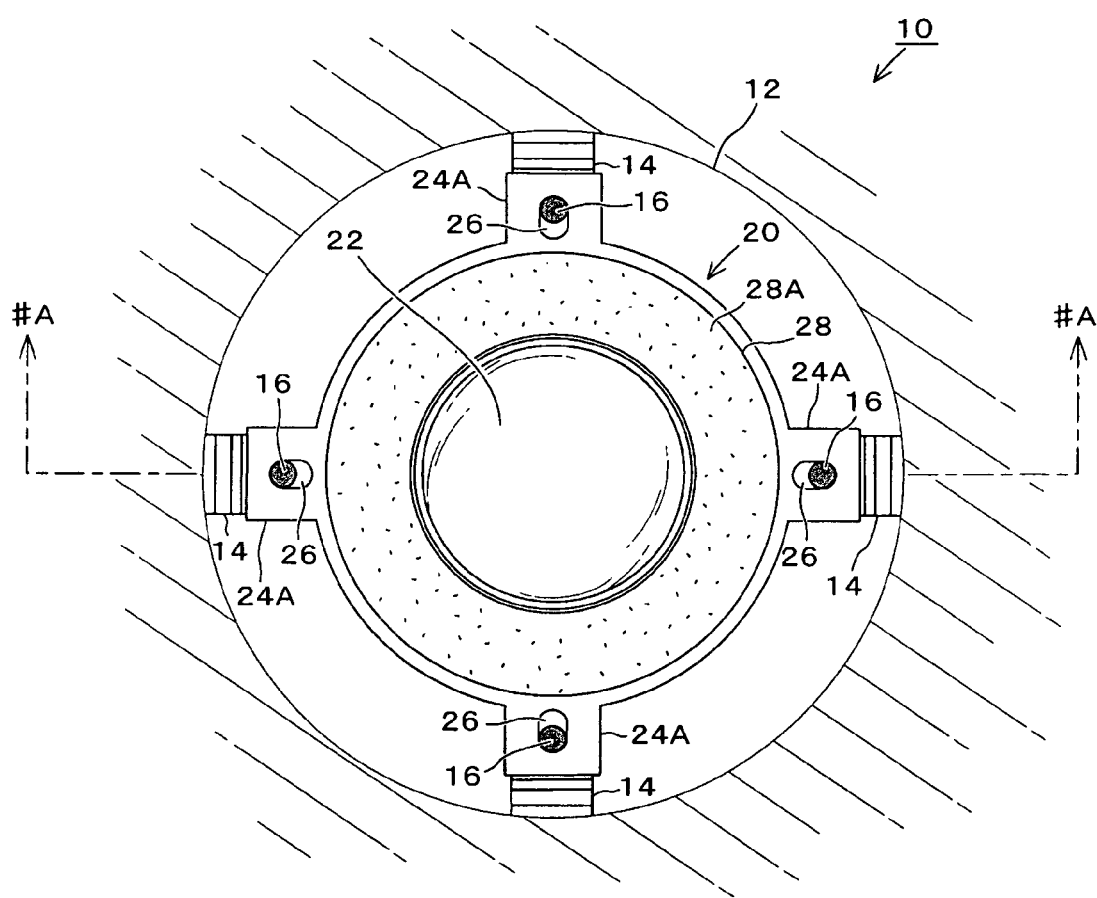

[Fig. 3]
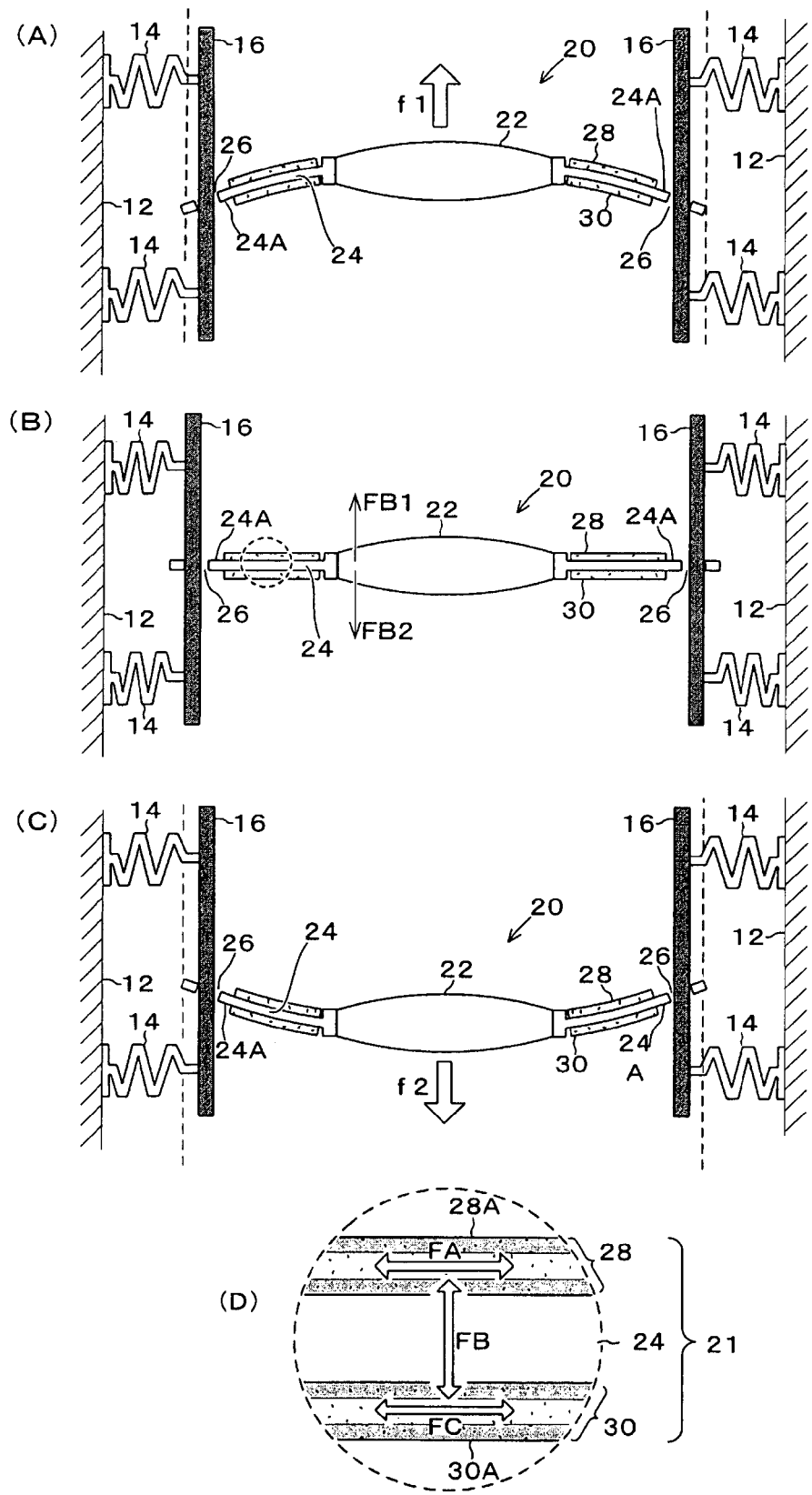

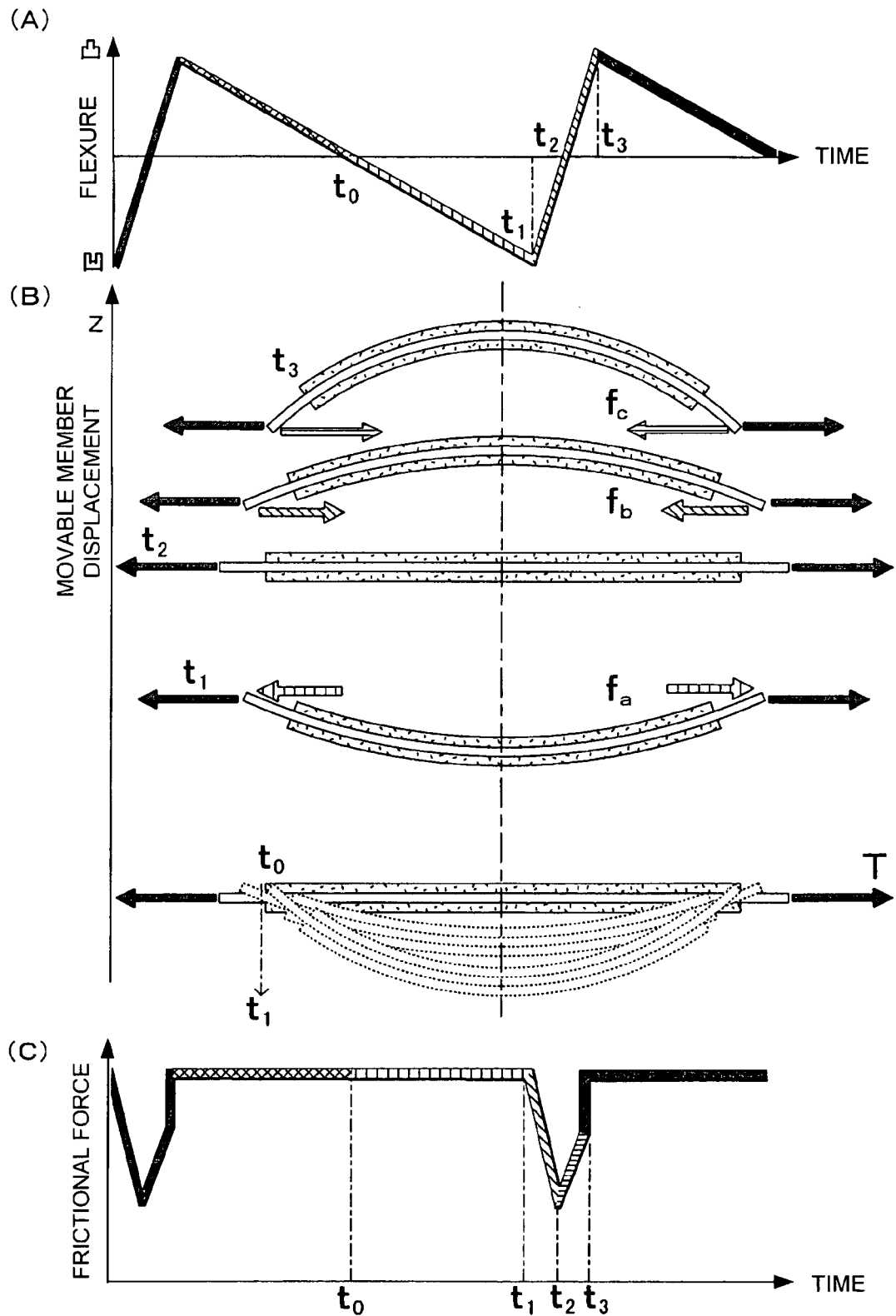

[Fig. 5]
(A) DISPLACEMENT IN DIRECTION FB1
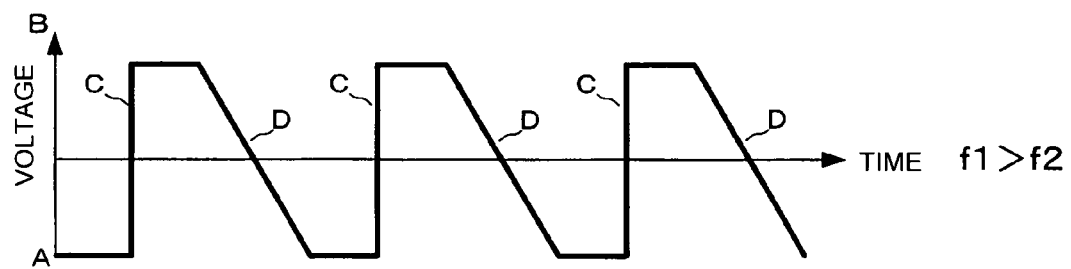
(B) DISPLACEMENT IN DIRECTION FB2
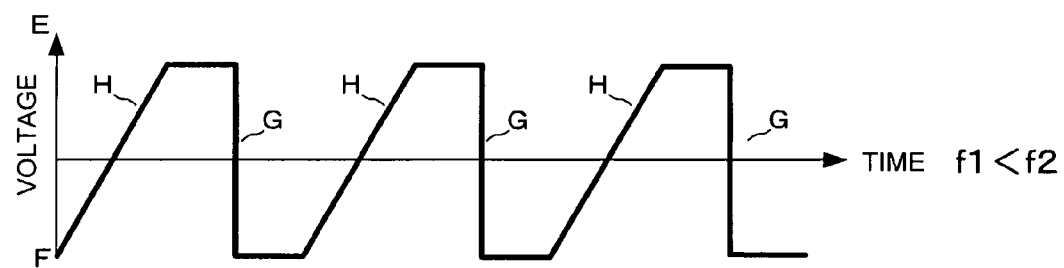

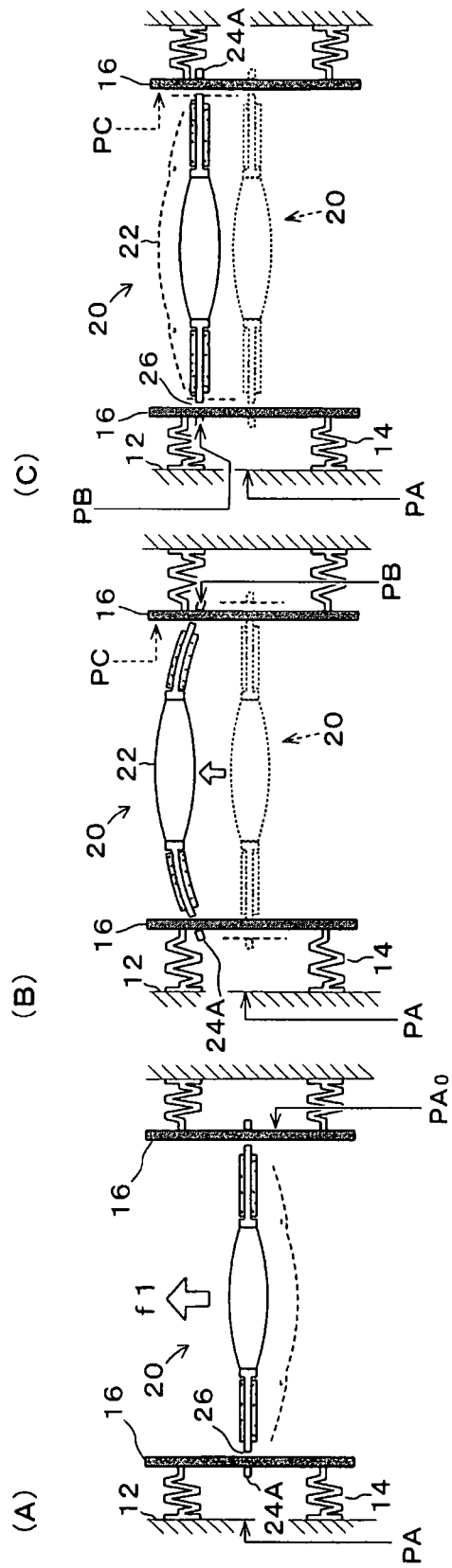
[Fig. 6]

[Fig. 7]
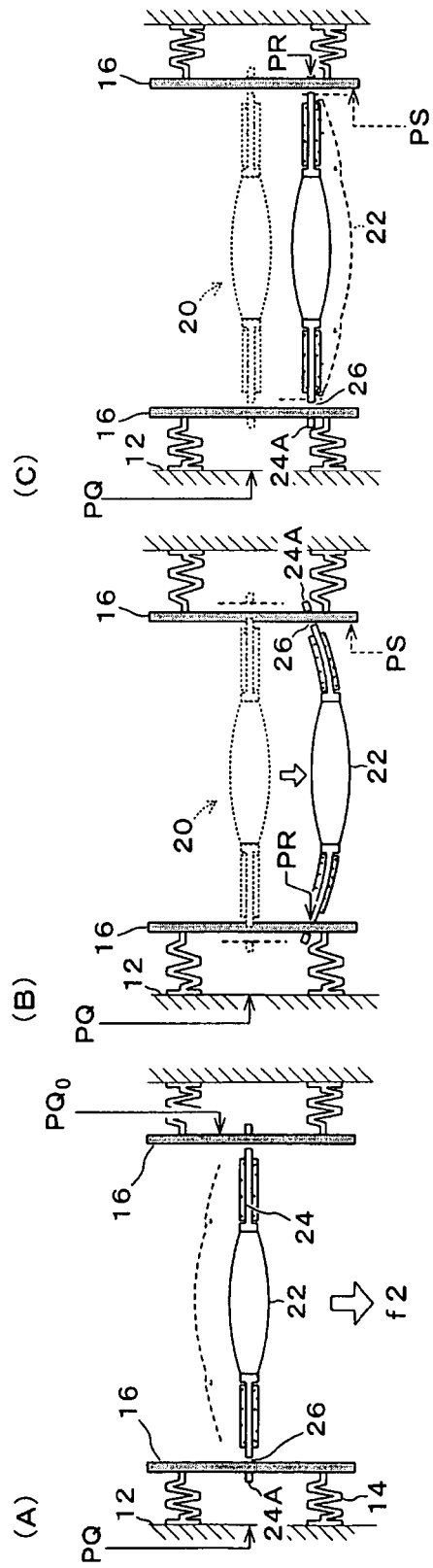

[Fig. 8]
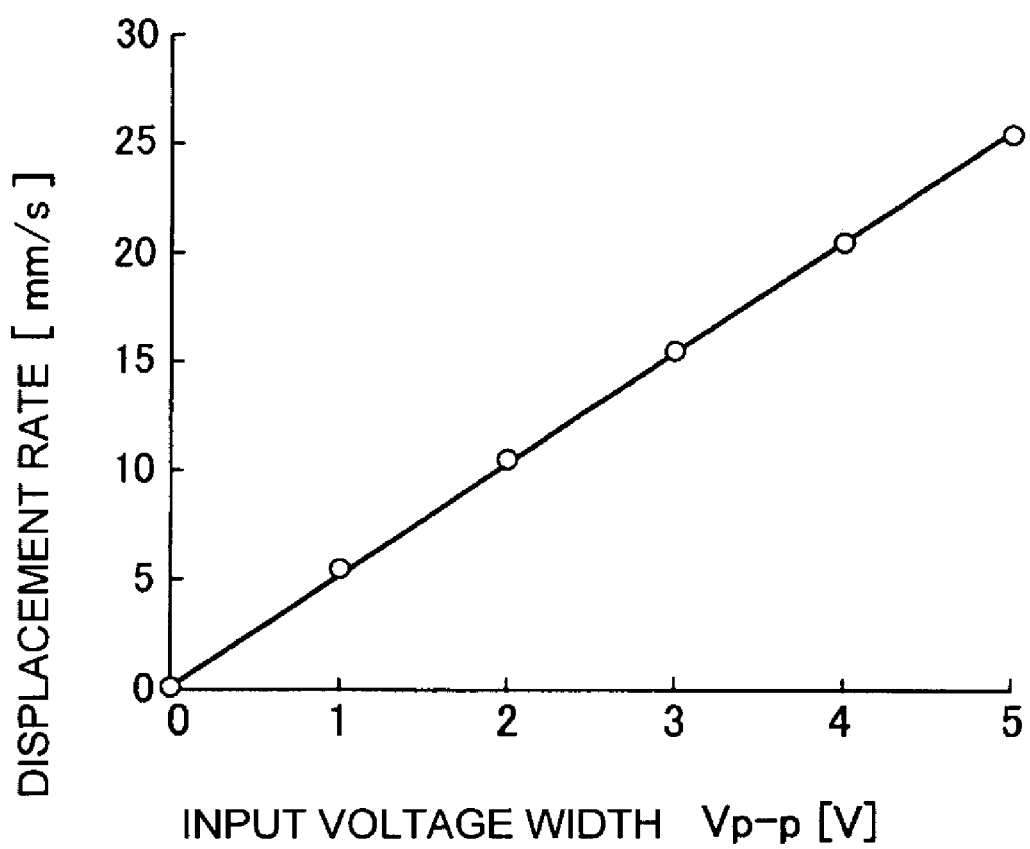

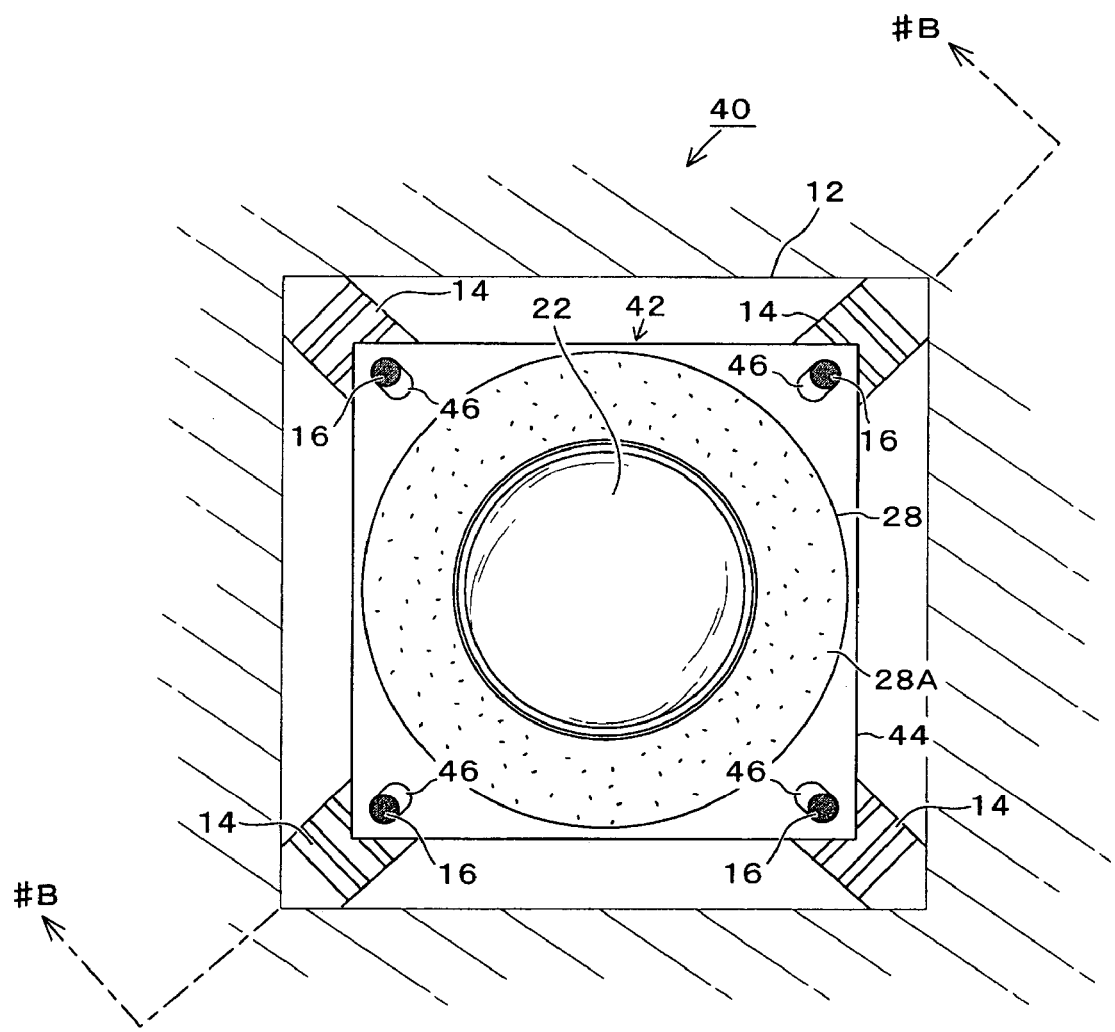
[Fig. 9]

[Fig. 10]
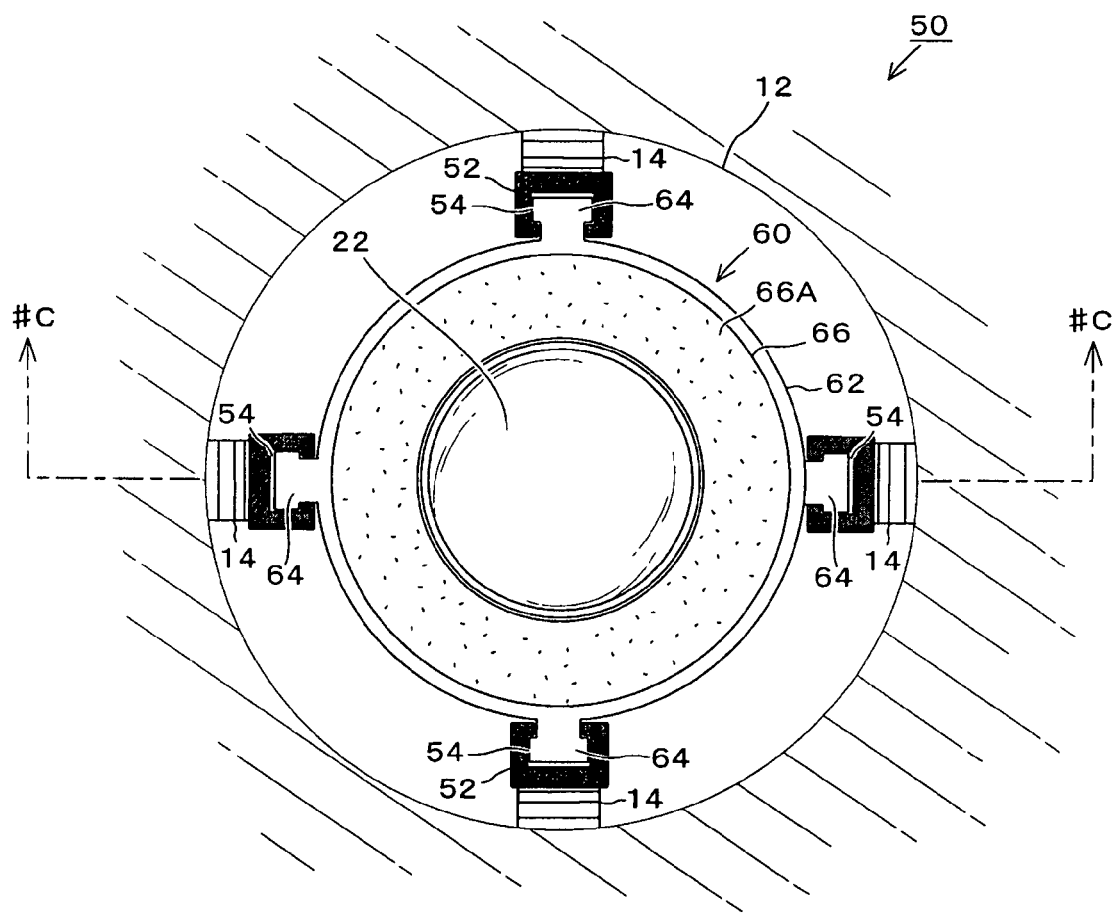

[Fig. 11]
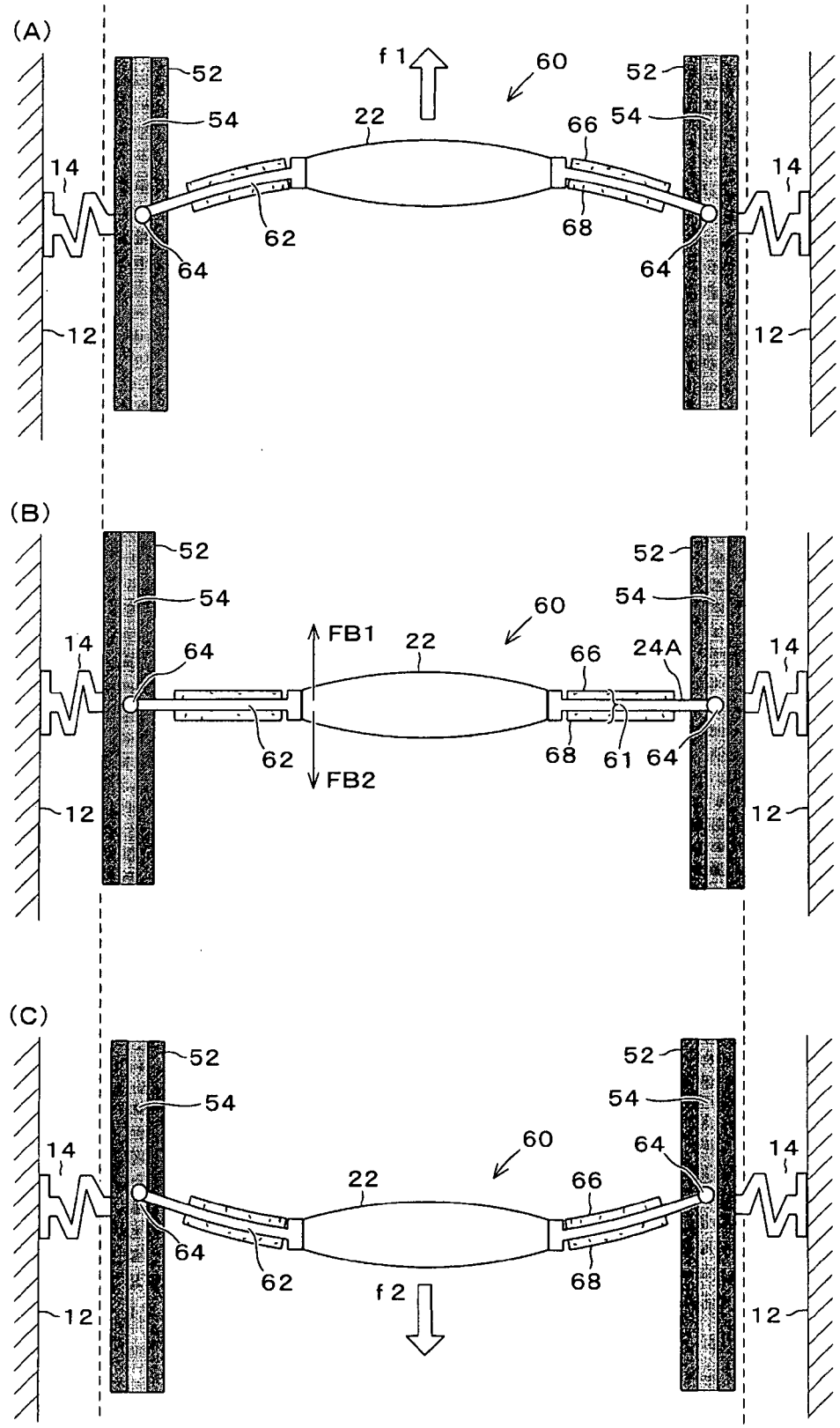

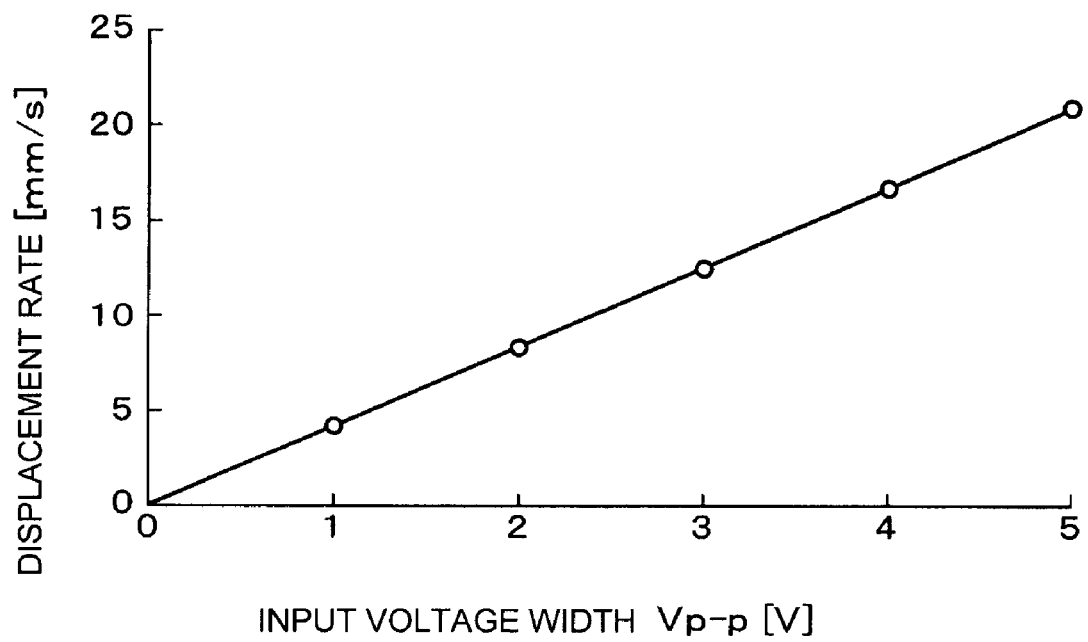
[Fig. 12]

[Fig. 13]
(A)
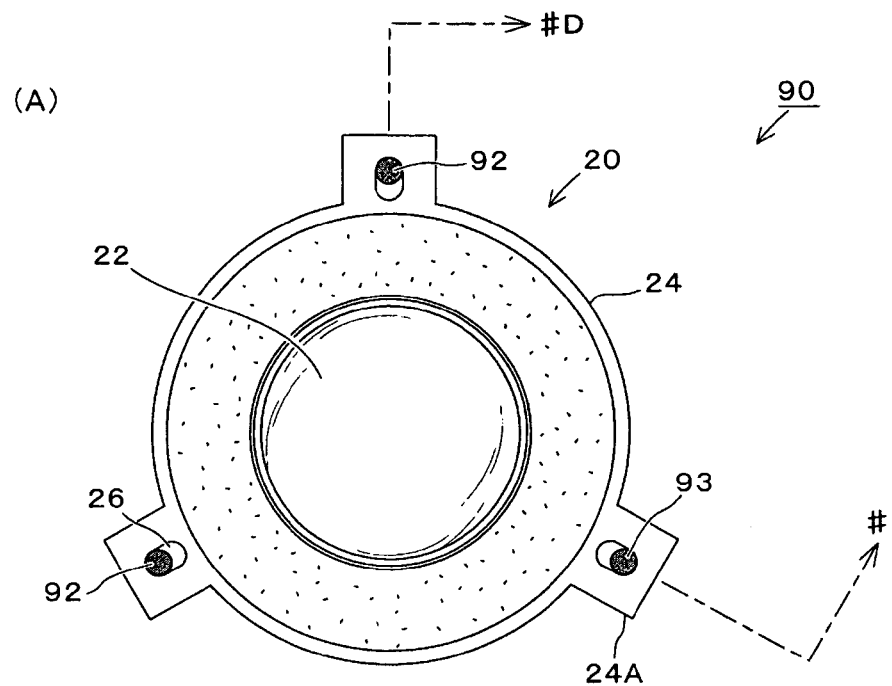
(B)
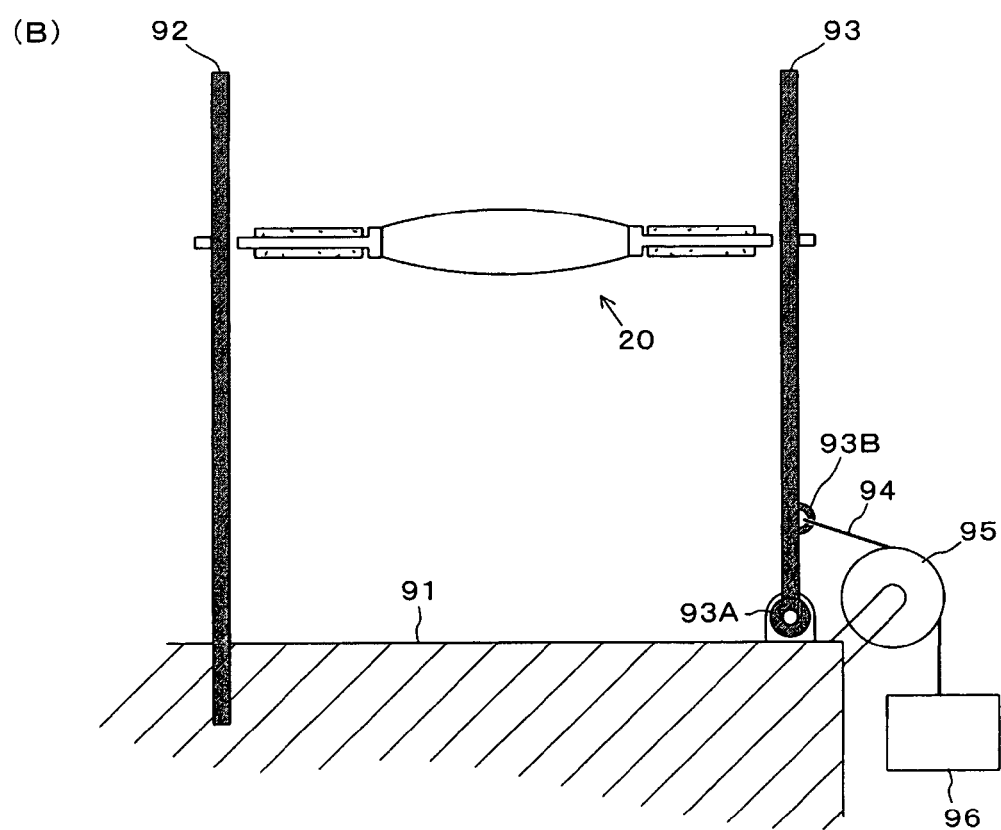

[Fig. 14]
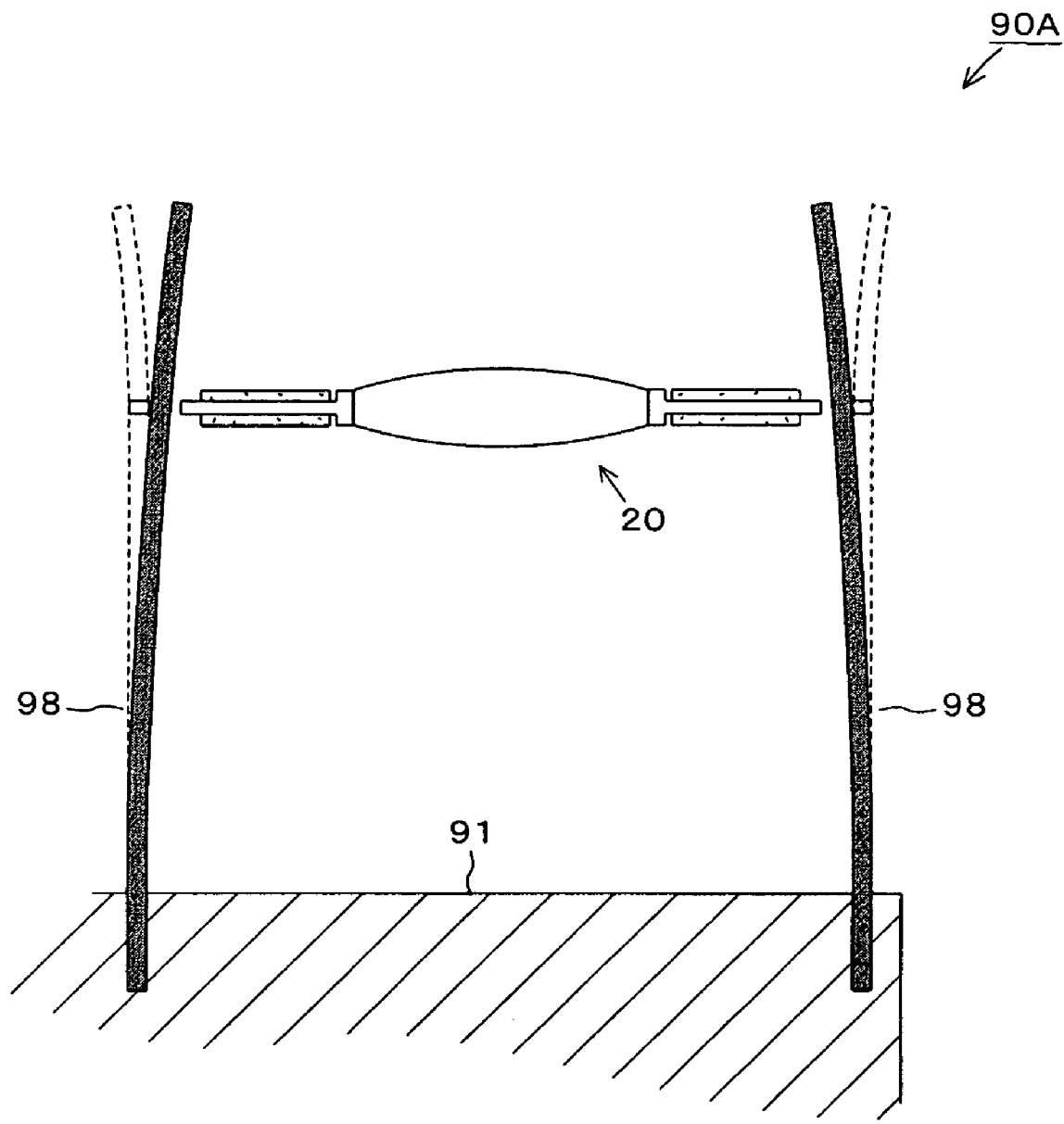

[Fig. 15]
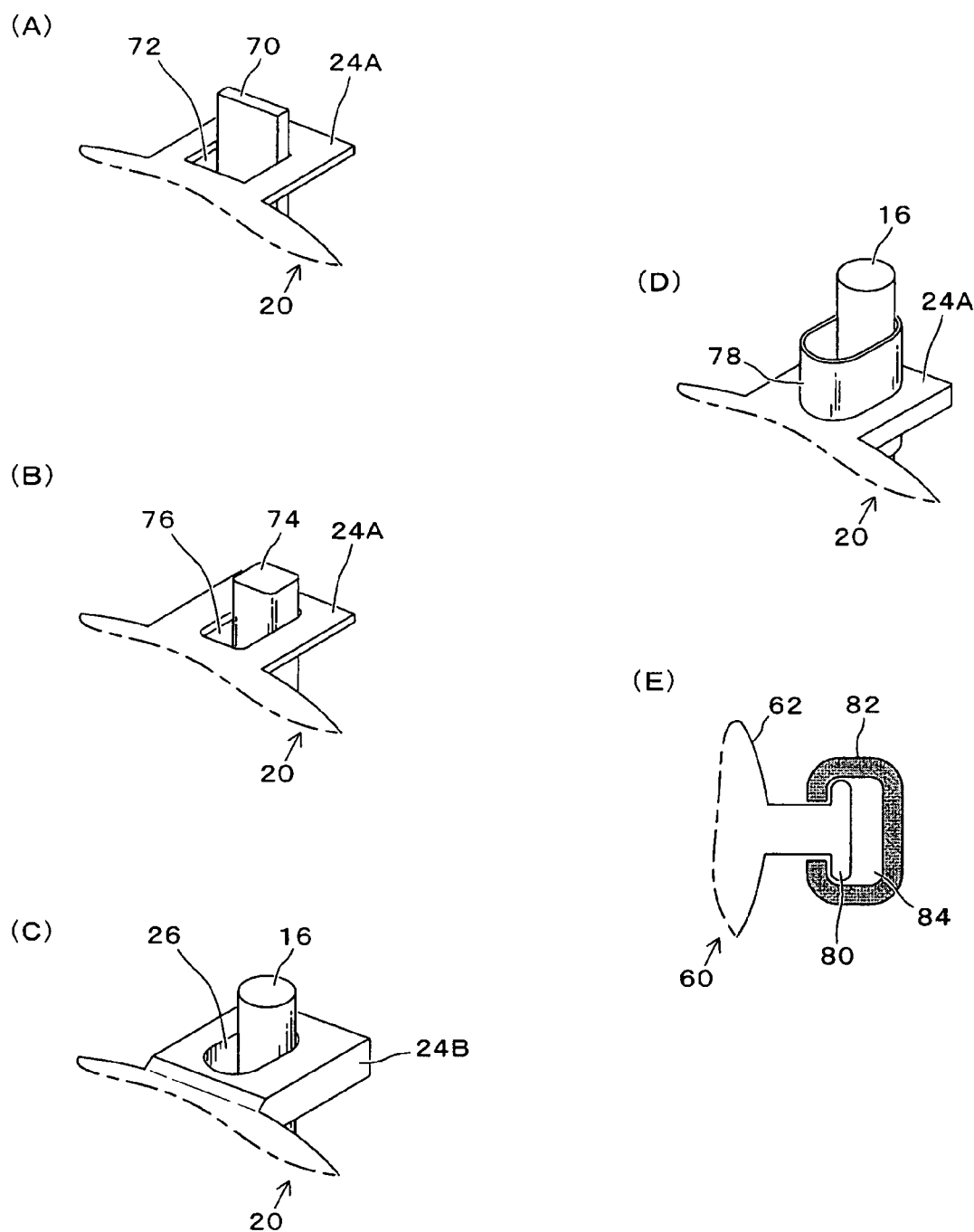

[Fig. 16]
(A)
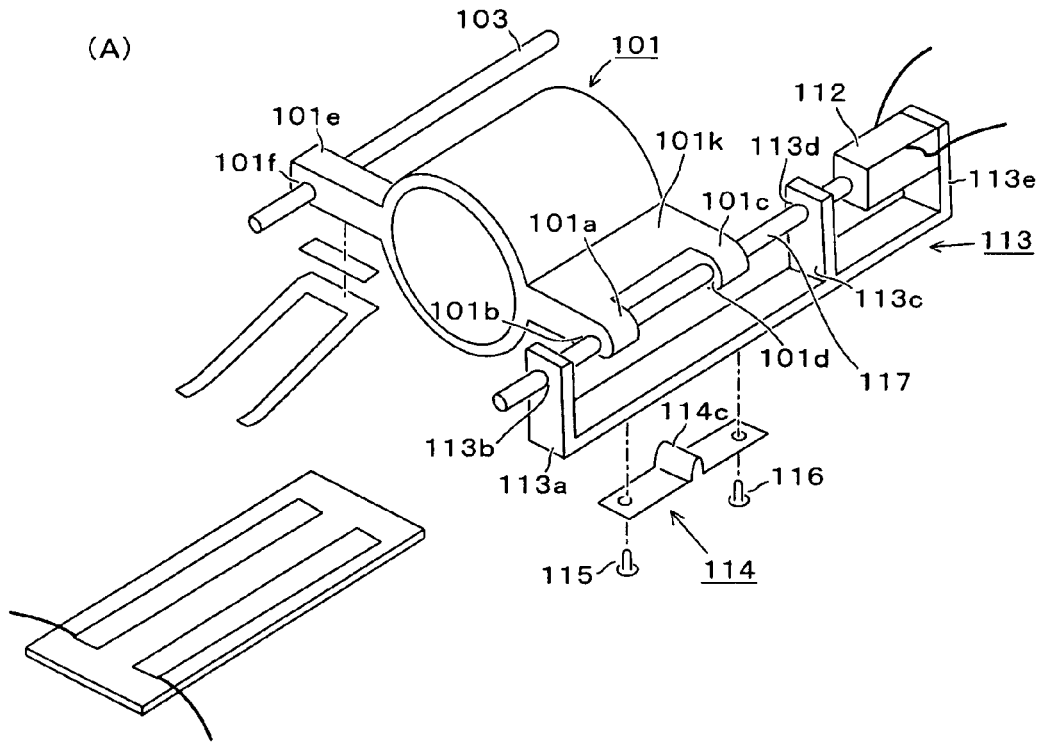
(B)
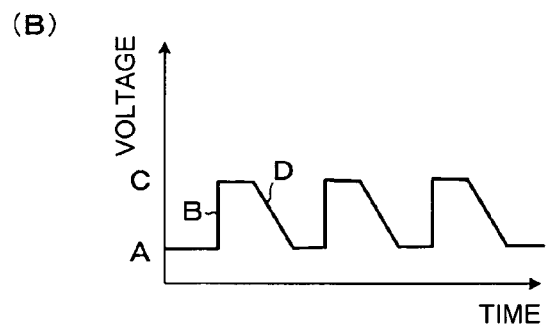
(C)
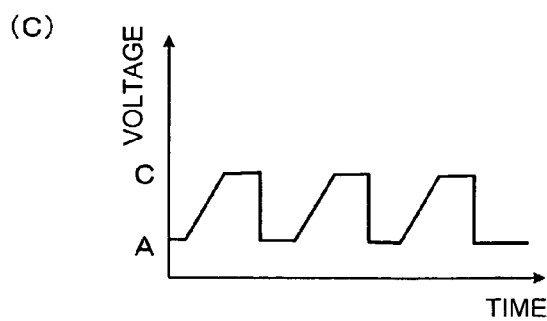

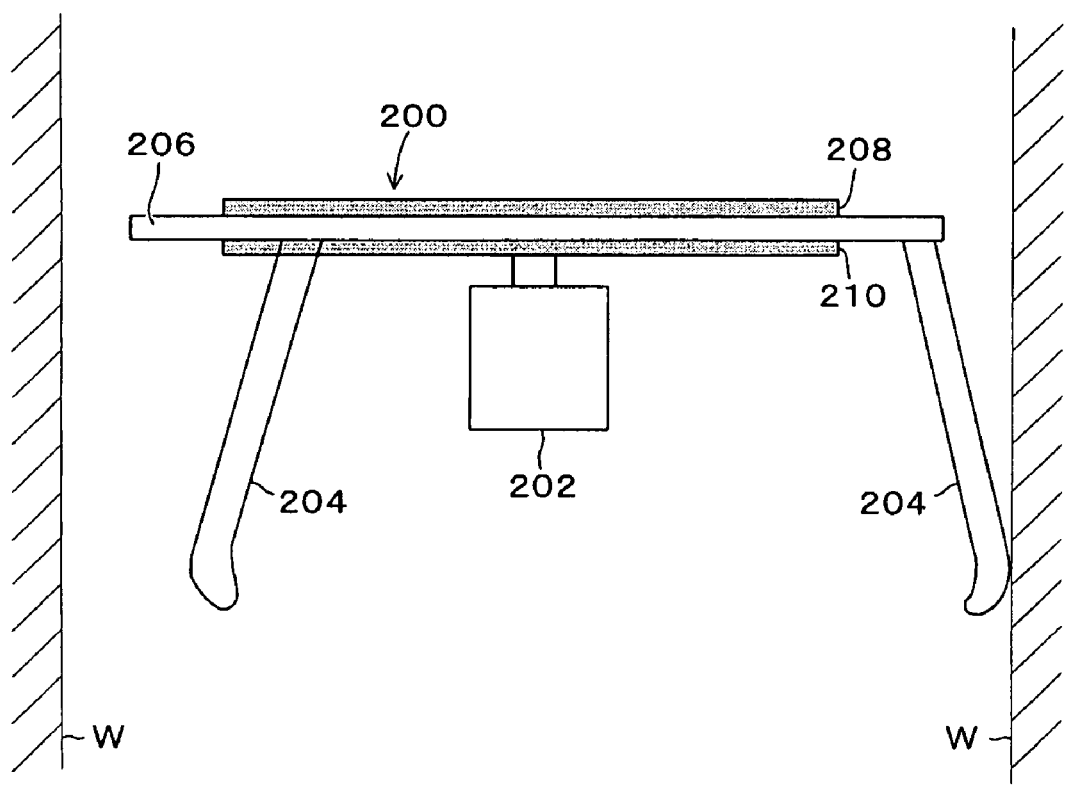
[Fig. 17]

DRIVING DEVICE

BACKGROUND OF THE INVENTION

1. Field of the Invention

The field relates to a driving device (actuator) for driving a displacement object, or driven member, by use of a surface-deforming element such as an electromechanical transducer element.

2. Description of the Related Art

Conventionally, proposals have been made in JP-A-4-69070 and JP-A-7-298654 on the arts for driving a lens or the like used for various optical apparatuses, precision instruments, and video apparatuses, etc., such as cameras, overhead projectors, binocular glasses, copiers, plotters and X-Y drive tables. Those have already been realized in practical application. FIGS. 16A-16C illustrate the disclosure in JP-A-4-69070 wherein FIG. 16A is a schematic view of a driving device while FIGS. 16B and 16C show a relationship between a voltage and a time. The lens driver shown in FIG. 16A has a lens barrel 101 supporting a lens and a guide bar 103 supporting the lens barrel 101 and guiding it in an optical-axis direction. The guide bar 103 is passed through a fork 101f formed in a support 101e extending from the lens barrel 101, to support and guide the lens barrel 101.

Meanwhile, a driving rod 117 is provided serving also as a lens-barrel support member for driving the lens barrel 101 axially, to support the lens barrel 101 together with the support 101e. The driving rod 117 is inserted in holes 13b and 13d formed respectively in rises 113a and 113c of a driving-rod support member 113, thus being able to move axially. Meanwhile, the driving rod 117 extends through the holes 101b and 101d formed at both ends 101a and 101c of a squared-U portion 101k extending from the lens barrel 101 opposite to the support 101e. Furthermore, the driving rod 117 has a rear end fixed to a front end of a piezoelectric element 112. The piezoelectric element 112 has a rear end fixed to another rise 113e of the driving-rod support member 113.

Furthermore, a leaf spring 114 is attached to both ends 101a and 101c of the lens barrel 101 from below by screws 115 and 116. The leaf spring 114 is parallel with the driving rod 117 and contains a friction portion 114c in the middle projecting upward. By a contact of the friction portion 114c with the driving rod 117, friction occurs between the lens barrel 101 and the driving rod 117, making it possible to drive the lens barrel 101. Friction is caused by a spring pressure of the leaf spring 114.

FIGS. 16B and 16C illustrate voltage waveforms to be applied to the piezoelectric element 112, wherein FIG. 16B shows a voltage waveform to be applied upon moving the lens barrel 101 rightward in FIG. 16A while FIG. 16C shows a voltage waveform to be applied upon moving it leftward. When a voltage waveform shown in FIG. 16B is applied to the piezoelectric element 112, the piezoelectric element 112 abruptly expands in a sharp rise from voltage A to voltage B. At the same time, the driving rod 117 also moves leftward in FIG. 16A by an amount equal to the elongation of the piezoelectric element 112. However, the lens barrel 101 moves less than the driving rod 117 because of its inertia. Conversely, during a slow change from voltage C to voltage A, the piezoelectric element 112 contracts (returns) slowly. By a frictional force between the lens barrel 101 and driving rod 117 and a frictional force between the leaf spring 114 and driving rod 117, the lens barrel 101 is moved rightward in FIG. 16A. When the lens barrel 101 needs to be moved leftward in FIG. 16A, a voltage with a waveform as shown in FIG. 16C is applied to the piezoelectric element 112, thereby causing it to move in opposite direction. Additionally, the driving device disclosed in JP-A-7-298654 is structured, in JP-A-4-69070, to readily exchange parts and make a repair upon a failure or so on the driving side, whose basic driving mechanism is similar to that of JP-A-4-69070.

Furthermore, JP-A-8-207755 discloses an in-bore moving device (actuator) having a surface-deforming element 200 such as a piezoelectric bimorph having a radius of curvature changing with an applied voltage, a weight 202 fixed in the center of the surface-deforming element 200, clamp legs 204 fixedly held by an outer periphery of the surface-deforming element 200 and abutting against an inner wall W forming a surrounding hole, and control means for supplying an applied voltage having a regulated waveform to the surface-deforming element 200. In this actuator, a driving element and a movable member are integrated together. When the surface-deforming element 200 is flexed slowly, there is no movement because of a frictional force acting between the clamp legs 204 and the wall surface W. Then, when flexed reversely in a short time, a flexure force surpasses the frictional force due to an increase of acceleration force so that the actuator is moved in the acceleration direction. By the repetition of the operation, displacement takes place to enable movement within the bore.

In the meanwhile, there is a demand for the lens module for use on a cellular-phone digital camera to achieve, at low cost, such performance improvements as optical-element pixel densification, zooming and auto-focusing, and unintentional-movement prevention. However, in the background art shown in JP-A-4-69070, problems remain in size and cost reduction because of non-integral structure of the driving rod 117 and the lens barrel 101 to be displaced. Also, because the driving rod 117 is always in contact, on the same plane, with the holes 101b, 101d of the lens barrel 101 through which the driving rod 117 is passed, fixing readily occurs due to an occurrence of static electricity, etc. Moreover, because of the driving force orthogonal to fixing force, a fixing force theoretically could not be directly suppressed by a driving force, leaving a problem in respect of reliability. This is similar to JP-A-7-298654. Furthermore, the lens barrel 101 is susceptible to the effect of gravity because it hangs relative to the driving rod 117.

Still, in the art described in JP-A-8-207755, size reduction is not easy because the frictional force due to the clamp legs 204 is necessary as a holding force for the actuator. There are also problems of low displacement efficiency and low durability because the clamp legs 204 absorb the vibration of the surface-deforming element 200. Furthermore, there is a disadvantage of low displacement speed because the resonant frequency of the actuator readily lowers making it impossible to increase the driving frequency. In addition, comprising the weight 202, inertia is used to cause a movement. Thus, a discrepancy may arise between a downward movement speed and an upward movement speed, resulting in a disadvantageous variability in displacement speed.

Furthermore, each of the foregoing background arts uses, as its own holding force, the gravity acting upon the device weight or lens barrel. Accordingly, there is a dependency upon gravity during driving, and the gravity also has an influence during resting. Particularly, in the art of JP-A-8-207755, if there is a variation among the elastic forces of the clamp legs 204, a rotation may readily occur taking a direction orthogonal to the direction of displacement as an axis, making it difficult to control the position.

SUMMARY OF THE INVENTION

The present invention addressed the foregoing points and it is an object of the present invention to provide a driving device, which is small in size and light in weight but capable of performing a position control relative to the direction of displacement and also stable displacement and alignment, while reducing the effect of gravity.

According to the present invention, a driving device operates as follows: a tensile force is given in a plurality of different directions to a plurality of points at an outer periphery of a surface-deforming element that is to deform on an applied voltage, thereby holding the surface-deforming element.

According to another aspect of the invention, a driving device is to move a displacement object within a passageway, the device comprising: a surface-deforming element integrally attached with the displacement object and being flexible on an applied voltage; at least one urging means for giving a tensile force in a direction substantially orthogonal to a moving direction of the displacement object; and a plurality of holding mechanism for applying a tensile force from the urging means to an outer periphery of the surface-deforming element in a direction from an inner to outer of the passageway and for guiding movement of the displacement object according to the moving range.

In one embodiment of the invention, the surface-deforming element is a piezoelectric vibrator bonded with a piezoelectric element having a lamination of a piezoelectric layer and an electrode layer on at least one of surfaces of a vibration plate thereof. In another embodiment of the invention, the holding mechanism includes guide means provided, at a tip of the urging means, continuously along a moving direction of the displacement object, and an opening formed in a protrusion provided at the outer periphery of the surface-deforming element and allowing the guide means to slide through in a direction of urging or tension due to the urging means. Alternatively, the holding mechanism includes guide provided, at a tip of the urging means, continuously along a moving direction of the displacement object, and an opening formed in a peripheral edge of the surface-deforming element and allowing the guide means to slide through in a direction of urging or tension due to the urging means. In another embodiment, the holding mechanism includes a protrusion provided at the outer periphery of the surface-deforming element, and guide means in a rail form provided, at a tip of the urging means, continuously along a moving direction of the displacement object and formed with a groove, for engagement with the protrusion, along the moving direction of the displacement object. The urging means may use a spring or load. The holding mechanism may serve also as the urging means. Furthermore, in another embodiment, the holding mechanism is capable of suppressing a rotational motion of the displacement object around an axis in a moving direction thereof during a movement of the surface-deforming element, or capable of suppressing a rotational motion of the displacement object around an axis in a direction orthogonal to a moving direction thereof during a movement of the surface-deforming element. The foregoing and other objects, features and advantages of the invention would become apparent from the ensuing detailed description and appended drawings.

According to the invention, the driving device, for moving a displacement object within a passageway, is integrally provided with a surface-deforming element that is to flex on an applied voltage and a displacement object. By utilizing at least one urging means for giving a tensile force in a direction substantially orthogonal to a moving direction of the displacement object, the surface-deforming element is to be held by applying a tensile force to an outer periphery thereof in a direction from an inner to outer of the passageway. Accordingly, position can be stabilized while reducing the effect of gravity. Despite small in size and light in weight, the driving device is able to carry out stable displacement and alignment.

BRIEF DESCRIPTION OF THE DRAWINGS

FIG. 1 is a perspective view showing an overall structure of a driving device in a first embodiment of the present invention;

FIG. 2 is a plan view of the driving device of FIG. 1 as viewed in an optical-axis direction thereof;

FIGS. 3A-3D are sectional views taken along line #A-#A in FIG. 2 wherein in FIG. 3A the actuator is flexed maximally upward, in FIG. 3B the actuator is in a state free from flexure, in FIG. 3C the actuator is flexed maximally downward, and in FIG. 3D the actuator is partly magnified in FIG. 3B;

FIGS. 4A-4C are figures showing a movable member flexure state, movable member displacement and frictional force change against a passage of time in the first embodiment;

FIGS. 5A and 5B are figures showing a relationship between a voltage to be applied to the movable member and a time in the first embodiment;

FIGS. 6A-6C are explanatory views showing a manner of upward movement in the first embodiment;

FIGS. 7A-7C are explanatory views showing a manner of downward movement in the first embodiment;

FIG. 8 is a figure showing a relationship between a displacing speed of and an input voltage to the movable member in the first embodiment;

FIG. 9 is a plan view of an example of displacement of the driving device of the first embodiment as viewed in an optical-axis direction thereof;

FIG. 10 is a plan view of a driving device in a second embodiment of the invention as viewed in an optical-axis direction thereof;

FIGS. 11A-11C are sectional views taken along line #C-#C in FIG. 10 wherein in FIG. 11A the movable member is flexed maximally upward, in FIG. 11B the movable member is free from flexure, and in FIG. 11C the movable member is flexed maximally downward;

FIG. 12 is a figure showing a relationship between a displacing speed of and an input voltage to the movable member in the second embodiment;

FIGS. 13A and 13B are views showing a third embodiment of the invention wherein FIG. 13A is a plan view and FIG. 13B is a cross-sectional view taken along #D-#D in FIG. 13A;

FIG. 14 is a cross-sectional view showing a fourth embodiment of the invention;

FIGS. 15A-15E are views showing another embodiment of the invention;

FIGS. 16A-16C are figures showing an example of a background art; and

FIG. 17 is a figure showing an example of a background art.

DESCRIPTION OF THE PREFERRED EMBODIMENTS

Certain embodiments will be described with reference to the figures.

Referring to FIGS. 1 to 8, description is first made on a first embodiment of the invention. This embodiment is used as a focus-lens driving device (actuator) for an optical apparatus. FIG. 1 is a perspective view showing the overall structure of a driving device according to this embodiment while FIG. 2 is a plan view of the FIG. 1 driving device as viewed in an axial direction of a lens. FIGS. 3A to 3D are cross-sectional views of the FIG. 2 driving device taken along line #A-#A and viewed in a direction of arrow, wherein FIG. 3A shows a state in which the movable member is displaced maximally upward, FIG. 3B shows a state in which the movable member is free of flexure, and FIG. 3C shows a state in which the movable member is displaced maximally downward, and FIG. 3D magnifies a part of what is shown in FIG. 3B.

A driving device 10 in the first embodiment is for moving (or displacing) a lens 22 as a displacement object within a passageway 12. This is structured that a movable member (or actuator body) 20 is held by a plurality of shafts 16 (four in the illustrated embodiment) provided at tips of springs 14 extended toward the center from the inner surface of the passageway 12. The springs 14 extend nearly orthogonal to the axis of the passageway 12. The shafts 16 are arranged lengthwise, or along the optical axis direction, inside the passageway 12 in a manner covering at least the range the movable member 20 is to move (transfer range). By utilizing elastic forces of the springs 14 and applying tensile forces acting toward the passageway 12 to the outer periphery of the movable member 20, the movable member 20 is held at its outer periphery. The shafts 16 like those are to function as a guide to move the movable member 20. Note that the number of the springs 14 may be suitably changed in accordance with a length of the shaft 16.

The movable member 20 is integrally structured that a lens 22 is integrally arranged in the center of a piezoelectric vibrator (surface-deforming element) 21 provided with piezoelectric elements 28, 30, each formed by a piezoelectric layer and an electrode layer, provided on both surface of a vibration plate 24. The vibration plate 24 employs, say, a metal plate while the piezoelectric layer 24 is formed, say, of PZT. The electrode layer is formed of Ag or Ag—Pd alloy but not limited to those. Flat protrusiones 24A are formed radially outwardly protruding at a proper interval, in an outer periphery of the vibration plate 24. In this embodiment, four protrusiones 24A are provided at an interval of approximately 90 degrees. The protrusiones 24A are formed of the same material as the vibration plate 24 so that they can be warped or flexed together with the vibration plate 24.

Meanwhile, the protrusion 24A is provided with an opening 26 in an elongated form allowing the shaft 16 to penetrate through it. The opening 26 is previously set up broader in radial width than the diameter of the shaft 16 so that the shaft 16 can slide in the opening 26 in an urging or tensile direction by an elastic force of the spring 14. Consequently, in a state free of flexure, the shaft 16 abuts against the opening 26 at its inner face closer to the passageway 12, as shown in FIG. 3B. In a state the movable member 20 is flexed upward or downward, the opening 26 at its edge contacts the shaft 16, as shown in FIGS. 3A and 3C. Incidentally, although the protrusion 24A in the illustrated example is flat in shape, it may be thickened lengthwise of the shaft 16 so that adjustment can be made as to the contact area of between the opening 26 and the shaft 16.

The movable member 20 has an exterior size (diameter including the protrusiones 24A) of approximately 10 mm×10 mm, for example. The first embodiment was of the bimorph type having the piezoelectric elements 28, 30 on both surfaces of the vibration plate 24, but it may be of a unimorph type having a piezoelectric element on any one of the surfaces of the vibration plate 24.

The manufacturing procedure for a movable member 20 constructed as above, if exemplified, is as follows. First, an aperture is formed of a predetermined size, for receiving a lens 22, in the center of a metal vibration plate 24 in a disc form having protrusiones 24A in an outer periphery thereof. Then, a lens 22 is fixed in the aperture by suitable means. Ring-formed piezoelectric elements 28, 30, each having a predetermined size and having an inner diameter greater than the outer diameter of the lens 22, are bonded on both surfaces of the vibration plate 24 by use of suitable means, such as a conductive adhesive. The bonding is made such that the piezoelectric elements 28, 30, for polarizing thicknesswise, after bonding, have a polarization in the same direction as the optical axis of the lens 22. Then lead wires, not shown, are connected to the electrode layer 28A of the piezoelectric element 28, the electrode layer 30A of the piezoelectric element 30 and the vibration plate 24, respectively.

In case a signal is applied between the electrode layers 28A, 30A and the vibration plate 24 through a not-shown lead wires, expansion and contraction shown at arrows FA, FC in FIG. 3D is opposite in direction to each other because the piezoelectric layers of the piezoelectric elements 28, 30 are same in polarization direction. Namely, when the piezoelectric element 28 expands in the direction of arrow FA, the piezoelectric element 30 is contracted in the direction of arrow FC. Hence, those in the entire expand upward in the showing of arrow FB (in a direction of FB1). In the state of flexure maximally upward, they assume a state shown in FIG. 3A. Conversely, when a voltage is applied to contract the piezoelectric element 28 in a direction of arrow FA, the piezoelectric element 30 expands in a direction of arrow FC. Hence, those in the entire expand downward in the showing of arrow FB (in a direction of FB2) wherein, in the state of flexure maximally downward, it is in a state as shown in FIG. 3C. Note that the arrow f1 shown in FIG. 3A represents an upward force acting on the protrusion 24A during upward flexure while the arrow f2 represents a downward force acting during downward flexure. When the movable member 20 is flexed upward or downward, the four protrusiones 24A also are warped together with the vibration plate 24 so that the movable member 20 contacts into a smaller diameter thereby moving the contacts between the shafts 16 and the openings 26, as shown in FIGS. 3A and 3C. In addition, in this embodiment, the movable member 20 is held by applying tensile forces through utilization of elastic forces of the springs 14 such that the shafts 16 pass through the openings 26 straight in a direction from the center to outer periphery of the movable member 20. Consequently, even in a state the movable member 20 is in a maximal flexure upward or downward thereof, the shafts 16 are pulled in a direction from an inward to outward of the passageway 12 by the springs 14 and placed into abutment against the inner surfaces of the opening 26 closer to the passageway 12, causing frictional forces acting upon the protrusiones 24A. Thus, the movable member 20 does not fall down.

Here, explanation is made on the fundamental mechanism of driving where the movable member 20 at its outer periphery is held by tensile forces. FIG. 4A shows a relationship between a passage of time and a flexure state of the movable member 20. FIG. 4B shows a relationship between a passage of time and a displacement of the movable member 20. FIG. 4C shows a relationship between a passage of time and a frictional force. In FIGS. 4A to 4C, the movable member 20 at time $t_0$ is assumably flat in form free of flexure.

The movable member 20 flat in form at time $t_0$ flexes downward up to time $t_1$ wherein the contact between the shaft 16 and the opening 26 is pulled radially by a constant tensile force T and the movable member 20 is held in position by a frictional force. At time $t_1$-$t_0$, the movable member 20 is to quickly return from a concave state to a flat state. Because the spring force fa at that time when the movable member 20 is to change into a flat shape decreases the tensile force at the contact, the force in a direction of displacement (Z direction in FIG. 4B) surpasses the frictional force so that the movable member 20 begins to move in the Z direction. The frictional force decreases rapidly due to a change into a dynamic friction and a reduction in tensile force at the contact. At the time $t_1$-$t_2$, the movable member 20 has an increased displacement amount in the Z direction. Subsequently, at time $t_2$-$t_3$, the movable member 20 quickly flexes from the flat state into a protrusion state wherein the spring force fb, fc at a time the movable member changes into a protrusion shape raises the tensile force at the contact. This increases the frictional force and decreases the displacement amount in the Z direction. At time $t_3$ or later, the movable member 20 slowly returns from the protrusion state to a flat shape wherein the position in a displacement direction itself is held. In addition, the movable member 20 is stable in position in the direction along the tensile force so that, even if the movable member 20 becomes stationary at time $t_3$ or later, the frictional force increase is great and the position of the movable member 20 does not change. Namely, the state along a plane having the direction of displacement as a normal line is the most stable wherein there encounters no positional inclination.

Assuming that the movable member 20 at its outer periphery is urged by the springs 14, the movable member 20 is urged also from the outer by the springs 14 in addition to the spring forces fb, fc of the movable member 20 itself when the movable member is in a state of flexing upward at time $t_2$-$t_3$. Thereupon, although the movable member 20 increasingly displaces in the Z direction, the movable member 20 becomes instable in position wherein there is a possibility that it begins to rotate with its plane parallel to the Z direction. However, because the first embodiment is structured for holding the movable member 20 by means of tensile forces, this state is suppressed when the frictional force acting upon the movable member 20 rapidly decreases during driving. Even in case there are variations in the tensile forces applied by the plurality of springs 14, a moment of rotation acts so that the plane of the member becomes parallel to the plane nearly orthogonal to the Z direction and hence stable position can be kept at all times.

Referring to FIGS. 5 to 7, the operation of the first embodiment is now described. FIGS. 5A and 5B show a relationship between a voltage to be applied to the piezoelectric element and a time. FIGS. 6 and 7 are explanatory views showing an operation in this embodiment. FIGS. 6A to 6C show a manner of upward movement while FIGS. 7A to 7C show a manner of downward movement.

Referring to FIGS. 5A and 6A to 6C, description is first made in a case of driving in an upward direction. In FIG. 5A, the abscissa represents a time while the ordinate represents an applied voltage. In case a signal having a waveform shown in FIG. 5A is applied to the piezoelectric elements 28, 30, the movable member 20 repeats an operation that it rapidly flexes upward (in a direction of arrow FB1) in a sharp rise C of change from voltage A to voltage B and gradually returns to the former flat state in a fall D of moderate change from voltage B to voltage A. In this case, because acceleration is greater as flexure is faster, the upward force f1 acting upon the protrusion 24A becomes greater than the force f2 acting downward. Namely, f1>f2 is held, and the movable member 20 displaces upward as shown by arrow FB1.

This feature is described with reference to FIG. 6. At first, in case a sharp rise voltage is applied to the movable member 20 in a flat state free of flexure in a position PA as shown in FIG. 6A, the movable member 20 flexes upward to have a reduced overall diameter. Otherwise, in case a similar voltage is applied for the movable member 20 in a certain concave state in a position $PA_0$, the movable member 20 in its overall diameter increases into a flat state (state in the position PA) and then flexes upward to have a reduced overall diameter. Because acceleration is higher in the upward direction, the frictional force of the spring 14 due to the tensile force is surpassed and the entirety moves upward. At this time, the contact between the protrusion 24A in the outer periphery of the movable member 20 and the shaft 16 holding it moves at all times. Accordingly, the movable member 20 stably moves upward without being secured to the shaft 16, and then fixed in a position PB as shown in FIG. 6B. At this time, the central region mounted with the lens 22 lies in a position PC because of its momentum in the upward. Because the opening 26 is formed in a shape and size allowing the shaft 16 to slide only in the radial direction, the rotation during movement is suppressed. The operation so far is similar to the operation of up to the time $t_0$-$t_3$ shown in FIG. 4B.

Then, when the voltage slowly returned from B to A as shown at moderate fall D in FIG. 5A, the movable member 20 at its maximal movement portion (lens 22 region) returns downward from the position PC to a position PB with the protrusion 24A kept fixed in the position PB by a frictional force. Namely, the movable member 20 entirety becomes flat in shape in the position PB. By the force of the movable member 20 returning itself into a flat state and a tensile force of the spring 14, the shaft 16 is pulled back toward the passageway 12 into a state shown in FIG. 6C. By repeating the operation shown in FIGS. 6A to 6C, the movable member 20 can be driven upward.

Referring to FIGS. 5B and 7A to 7C, description is made on a case of driving in the downward. In FIG. 5B, the abscissa represents a time while the ordinate represents an applied voltage. In case a signal having a waveform shown in FIG. 5B is applied to the piezoelectric elements 28, 30, the movable member 20 repeats the operation that it rapidly flexes downward (in a direction of arrow FB2) in a sharp rise G changing from voltage E to voltage F and gradually returns to the former flat state in a rise H slowly changing from voltage F to voltage E. At this time, because acceleration is greater as flexure is faster, the downward force f2 acting on the protrusion 24A becomes greater than the force f1 acting upward. Namely, f2>f1 is held, and the actuator 20 displaces downward as shown by arrow FB2.

As shown in FIGS. 7A to 7C, in case a sharp fall voltage is applied to the movable member 20 in a flat state free of flexure in a position PQ, the movable member 20 flexes downward to have a reduced overall diameter due to the flexure. Otherwise, in case a similar voltage is applied to the movable member 20 in an upwardly flexed state in a position $PQ_0$, the movable member 20 in its overall diameter increases into a flat state (state in the position PQ) and then flexes downward to have a reduced overall diameter. Meanwhile, because of increased acceleration in the downward to surpass the frictional force with the shaft 16, the entirety moves downward. During the downward movement, the contact between the protrusion 24A in the outer periphery of the movable member 20 and the shaft 16 moves at all times. Accordingly, the movable member 20 is stably moved downward and fixed in a position PR without being secured to the shaft 16 nor being rotated during the movement. At this time, the central region mounted with the lens 22 lies in a position PS because of its momentum in the downward.

Here, when the voltage slowly returned from F to E as shown at moderate rise H in FIG. 5B, the movable member 20 at its maximal movement portion (lens 22 region) returns upward from the position PS to a position PR with the protrusiones 24A kept fixed in the position PR by a frictional force. Namely, the movable member 20 entirety becomes flat in shape in the position PR. By the force of the movable member 20 returning itself into a flat state and a tensile force of the spring 14, the shaft 16 is pulled back toward the passageway 12 into a state shown in FIG. 7C. By repeating the operation shown in FIGS. 7A to 7C, the movable member 20 can be driven downward.

FIG. 8 shows a relationship between a displacement rate of and an input voltage to the movable member 20 displaced within the passageway 12. In FIG. 8, the abscissa represents an input voltage width $V_{p-p}$ [V] while the ordinate represents a displacement rate [mm/s]. As shown in FIG. 8, the input voltage width $V_{p-p}$ and the displacement rate are nearly in a proportional relationship wherein a displacement rate of approximately 25 mm/s has been obtained at an input voltage width of 5V. Namely, the movable member 20 has been stable in a position parallel to a tensile force, i.e. parallel to the plane orthogonal to the shaft 16. Meanwhile, because the four contacts between the shafts 16 and the protrusiones 24A are moved at all times by the flexure in the movable member 20, it can be seen that the movable member 20 is to stably move at a constant speed even at a low drive voltage of nearly 1V without variations in the displacement rate or stop in the course thereof.

The first embodiment as discussed above provides the following effects.

(1) Because of being held by utilization of tensile forces, the movable member 20 can be held parallel to the plane nearly orthogonal to the displacement direction, thus stabilizing the position while reducing the effect of gravity.

(2) Because the movable member 20 is formed by integrating the lens 22 with the piezoelectric vibrator 21, the component parts can be reduced in the number thus enabling size reduction, weight reduction, manufacturing efficiency improvement and manufacturing cost reduction.

(3) Movement is stabilized because the movable member 20 is held by spring 14 elastic force.

(4) Because the contacts between the outer periphery of the movable member 20 and the shafts 16 are to move at all times during movement of the movable member 20, the movable member 20 and the shafts 16 are suppressed from being firmly fixed together, thus making it possible to stably drive the lens 22 in the displacement direction. Thus, durability is improved. Meanwhile, stable displacement rate can be kept regardless of moving direction.

(5) Because the shafts 16 prevent the movable member 20 from rotating during movement, stable alignment can be realized. Accordingly, preferred transfer is available with a transfer object in various kinds requiring rotation control.

FIG. 9 shows a plan view of a modification to the first embodiment as viewed in the optical axis direction. The sectional view, taken along line #B-#B and viewed in the direction of arrows, corresponds to the FIG. 3 discussed in the above. In a driving device 40 in this modification, the vibration plate 44 constituting a movable member 42 is nearly in a square form with openings 46, at four corners, to pass shafts 16. By utilizing the vibration plate 44 nearly in a square form, time and efforts can be saved in separately forming protrusiones in a circular vibration plate. This simplifies the manufacturing process. Also, in the illustrated example, the passageway 12 was made nearly square, which does not exclude the provision of a circular passageway. Furthermore, the shape of the opening 46 is mere one example and can be changed desirably to a sectional form of the shaft 16. In this modification, the basic operation and effect is similar to that of the example shown in FIGS. 1 to 8, and thus stable operation can be obtained.

Second Embodiment

Referring to FIGS. 10 to 12, a second embodiment is now described. Note that like or corresponding elements to those of the first embodiment are attached with the same references (true for the following embodiments). FIG. 10 is a plan view of a driving device 50 in the present embodiment as viewed in the optical axis direction. FIG. 11 is a cross-sectional view taken along line #C-#C and viewed in the direction of arrow in FIG. 10. Incidentally, FIG. 11A shows a manner a movable member 60 is in a maximal flexure in the upward, FIG. 11B a manner it is free of flexure and FIG. 11C a manner it is in a maximal flexure in the downward.

A driving device 50 in the present embodiment is structured that a movable member (actuator body) 60, structured to integrate a lens 22 as a displacement object and a piezoelectric vibrator 61, is held by holding guides 52 at tips of springs 14 provided on an inner surface of and directed toward the center of a passageway 12, as shown in FIGS. 10 and 11. The holding guides 52 are arranged lengthwise, or along the optical axis direction of a lens 22, on the inner surface of the passageway 12 so as to extend longer than the movable range (transfer range) of the movable member 60. The movable member 60 at its outer periphery is held by pulling the movable member 60 from inward to outward of the passageway 12 through utilization of elastic forces of the springs 14. The holding guide 52 at its inner side is formed with a groove 54 having nearly the same form as a generally-T hook 64 provided on an outer periphery of the movable member 60 and extending lengthwise of the passageway 12, or along the optical axis direction of the lens 22. The groove 54 serves also as a guide for the movable member 60 to move. The number of springs 14 may be properly changed in accordance with the length of the holding guide 52.

The piezoelectric vibrator 61 has piezoelectric elements 66, 68, each laminated with an electrode over a piezoelectric layer, bonded by proper means on both surfaces of a vibration plate 62, forming an aperture at the center to attach the lens 22. The lens 22 is attached in the central aperture by proper means. The vibration plate 62 at its outer periphery is formed with generally-T hooks 64 radially outwardly extending at a proper interval. In this embodiment, four hooks 64 are provided at an interval of approximately 90 degrees. The hooks 64 are formed of the same material as the vibration plate 62, for example, so that it can be warped or flexed together with the vibration plate 62. Meanwhile, the hook 64, generally circular in cross-section, has a curve portion to abut against an inner surface of the groove 54 regardless of a presence or absence of flexure. The hook 64 in this embodiment was generally-T in form, but may be suitably changed together with the groove 54 form of the holding guide 52.

The piezoelectric elements 66, 68 are provided such that polarization is to orient in the same direction along the optical axis direction similarly to the first embodiment, to which a voltage is applied through a not-shown lead wire. The material of the piezoelectric element 66, 68 is similar to that of the first embodiment. A unimorph type may be employed which has a piezoelectric element only on one of the surfaces of the vibration plate 62 similarly to the first embodiment.

The operation of the driving device 50 constructed as above is basically similar to that of the first embodiment. In case of applying a voltage with a waveform having a sharp rise C and a moderate fall D as shown in FIG. 5A, the movable member 60 moves upward as shown by arrow FB1 in FIG. 11. Similarly, in case of applying a voltage with a waveform having a sharp fall G and a moderate rise H as shown in FIG. 5B, the movable member 60 moves downward as shown by arrow FB2 in FIG. 11. The phenomenon the contact between the hook 64 and the groove 54 of the holding guide 52 moves at all times during upward or downward movement is similar to that of the first embodiment.

FIG. 12 shows a relationship between a displacement rate of and an input voltage to the movable member 20 displaced within the passageway 12. In FIG. 12, the abscissa represents an input voltage width $V_{p-p}$ [V] while the ordinate represents a displacement rate [mm/s]. As shown in FIG. 12, the input voltage width $V_{p-p}$ and the displacement rate are nearly in a proportional relationship wherein a displacement rate of approximately 20 mm/s has been obtained at an input voltage width of 5V. This embodiment also applies tensile forces to four points on the outer periphery of the movable member 60 similarly to the first embodiment. Accordingly, the movable member 60 is stabilized in position parallel to the plane orthogonal to the holding guide 52. Stable displacement is available at a constant speed even on a low drive voltage of nearly 1V without variations in the displacement rate or stoppage in the course thereof.

The effect of this embodiment is basically similar to that of the first embodiment. Namely, because the movable member 60 is held by tensile forces, positional stabilization is achieved. Meanwhile, integrating the piezoelectric vibrator 61 with the lens 22 enables size reduction, weight reduction, manufacturing efficiency improvement and manufacturing cost reduction. Furthermore, because the contact between the holding guide 52 and the hook 64 moves at all times during transfer, the holding guide 52 and the hook 64 are free from being fixed together, thus enabling stable movement without causing a displacement rate difference between transfer directions. In the present embodiment, because the hook 64 and the groove 54 of the holding guide 52 are engaged together as a rotation prevention mechanism, the movable member 60 is favorably suppressed from rotating during transfer. Thus, it encounters no positional deviation after transfer.

Third Embodiment

Referring to FIG. 13, a third embodiment of the invention is described. This embodiment shows another example of holding mechanism and urging means. FIG. 13A is a plan view while FIG. 13B is a cross-sectional view taken along line #D-#D and viewed in the direction of arrow in FIG. 13A. The movable member 20 in a driving device 90 of this embodiment is similar in structure to the first embodiment excepting that protrusiones 24A are provided at three points for the vibration plate 24. As shown in FIG. 13, the holding mechanism in this embodiment includes two first holding guides 92 planted on a support 91 in a cantilever form, and one second holding guide 93 having a base 93A rotatably supported on the support 91. Those holding guides 92, 93 are to penetrate through openings 26 in the protrusiones 24A provided on the movable member 20. In a position of the second holding guide 93 closer to the base 93A, a fulcrum 93B is provided to which one end of a wire 94 is connected for providing a tensile force. The wire 94 has the other end where a predetermined load 96 is hung through a pulley 95. This provides the second holding guide 93 with a tensile force acting from the inner to outer of a passageway for the movable member 20.

A tensile force caused by the load 96 is directly applied to only one holding guide 93 among the three holding guides. However, to the portions of the outer periphery of the movable member 20 supported by the first holding guides 92, a reactive force to the tensile force due to the second holding guide 93 also affects as vector components divided in directions toward the two first holding guides 92. Thus, a tensile force in a direction from inner to outer of the movement passageway is applied to the movable member 20 in a direction nearly orthogonal to a movement direction of the movable member 20.

The present embodiment provides the following features in addition to the features of the first embodiment. Namely, the two holding guides 92 are fixedly supported and one holding guide 93 is rotatably supported on the support 91 in a cantilever form. Because those holding guides 92, 93 are in a free state in the region from an intermediate to upper end except the base, the movable member 20 can be given a broad movable range and the movable member 20 can be easily attached over the holding guides 92, 93. Hooks or evaginations may be provided as required at the upper ends of the holding guides 92, 93 in order to prevent the movable member 20 from unintentionally falling out of the holding guides 92, 93. Although the first and second embodiments used the spring as urging means, this embodiment employs a hung load 96. Therefore, a tensile force can be easily adjusted to a desired value by adjusting the weight of the load 96.

Fourth Embodiment

Referring to FIG. 14, a fourth embodiment of the invention is described. Although the foregoing embodiments were structured with a holding mechanism and urging means separately, the present embodiment has a holding mechanism serving also as urging means. In a driving device 90A of this embodiment, the holding mechanism is structured with a plurality of holding guides 98 planted in a cantilever form on a support 91 such that the upper ends thereof are to be spread at a predetermined angle outwardly of a passageway for the movable member 20. The holding guide 98 is formed of a rod member having an elasticity, e.g. a glass fiber or a piano wire, thus serving also as urging means. Due to an elastic force of the holding guide 98, a tensile force is applied, from an inner to outer of the movement passage of the movable member 20, to the outer periphery of the movable member 20 in a direction nearly orthogonal to a movement of the movable member 20. Hooks or evaginations may also be provided at the upper ends of the holding guides 98 in order to prevent the movable member 20 from unintentionally falling out of the holding guides 98, similarly to the third embodiment described above.

In this embodiment, the plurality of holding guides 98 are supported in a cantilever form on the support 91 wherein the holding guides 98 are in a free state in the region from the intermediate region to the upper end except the base. Thus, the movable member 20 is given a broad movable range and the movable member 20 can be easily attached over the holding guides 98, similarly to the third embodiment described above. In addition to such an effect, in the present embodiment, the plurality of holding guides 98, or a holding mechanism, serve also as urging means. Hence, the structure is extremely simple, enabling device size and weight reductions. In addition, manufacturing process can be shortened and cost can be reduced because of the reduced number of components. Although the holding guides 98 were structured by elastic rod members, the holding guides 98 may be made rigid in part thereof, similarly to the third embodiment described above.

The invention is not limited to the foregoing embodiments but can be modified in various ways within a scope not departing from the invention. For example, the following is included.

(1) The materials, forms and sizes mentioned above are examples and can be modified so as to perform the similar functions. Particularly, the forms of the shafts, openings 26, 46 are examples and may be modified into a form provided that the movable member 20, 42 and the shafts 16 are contacted together to cause a frictional force. For example, in the structure of the first embodiment, the shaft 70 may be in a plate form and the opening 72 provided in the protrusion 24A may be rectangular, as shown in FIG. 15A. As shown in FIG. 15B, the shaft 74 may be in a rod form rounded at corners and the opening 76 is matched in form to the same. Besides, in case the shaft 16 is made oval, fan, semicircular in cross-sectional form by changing the form of the opening formed in the protrusion 24 or the vibration plate 44, it is possible to obtain a result similar to that of the first embodiment.

As shown in FIG. 15C, the protrusion 24B itself may be increased in thickness axially of the shaft 16 or, as shown in FIG. 15D, the protrusion 24A may be provided with a pipe-like penetration 78 generally elliptic in cross section extending axially of the shaft 16. Thus, the device is able to suppress not only the rotation about an axis in movement of the movable member 20 but also the rotation about an axis perpendicular to the moving direction.

Furthermore, the form of the hook 64 and the groove 54 of the holding guide 52 in the first embodiment is one example and can be suitably modified to reach the similar effect. For example, as shown in FIG. 15E, the tip cross-sectional form of a hook 80 provided in an outer peripheral edge of the vibration plate 62 may be in a track form to form a groove 84 in a holding guide 82 in a manner extending along the tip form of the hook 80.

(2) The piezoelectric vibrator may be in any of unimorph and bimorph structures. The piezoelectric element itself may be in a laminated structure that a piezoelectric layer and an electrode layer are laid one over another, wherein the number of layers, internal electrode connection pattern, extended line structure, etc. may be changed as required.

(3) The holding mechanisms in the foregoing embodiments are mere examples and can be appropriately changed in design to provide the similar effects. For example, although the first embodiment applied a tensile force to four points in an outer periphery of the movable member, in case one of the opposing two shafts 16 is fixed to apply a tensile force only from the other, an effect is obtained that the movable member 20 is stable in position in a parallel state to the plane orthogonal to the shaft 16. The number of holding mechanism may be increased or decreased as required provided that it is two or more. If they are preferably provided at three points or more, it is possible to obtain a high effect for positional stabilization.

(4) Although, in the foregoing embodiment, the holding mechanism had the rotation prevention mechanism, this design may be properly changed in accordance with the necessity or non-necessity to suppress the rotation of a moved object, such as a lens 22. For example, in the first embodiment, by extending the opening 26 of the protrusion 24A circumferentially, the movable member 20 is allowed to rotate within the range. This is true in the second embodiment, i.e. the movable member 20 may be structured rotatably by extending the groove 54 of the holding guide 52 circumferentially.

(5) The applied voltage waveform for driving may be properly set in accordance with a driving form. Meanwhile, the springs 14, the shafts 16 or the holding guide 52 may be utilized for supplying a driving voltage.

(6) The lens 22 in the foregoing embodiment is mere one example. The invention is applicable to the apparatuses in general having driving sections, such as plotters and X-Y driving tables, besides lens driving on an optical device, e.g. a camera picture-taking lens, a projection lens such as a overhead projector, a binocular lens and a copier lens.

According to the invention, a surface-deforming element flexing due to an applied voltage is integrated with a displacement object, wherein the surface-deforming element is held by a tensile force in a direction from an inner to outer of the passageway to an outer periphery thereof which is applied by utilization of urging means for in a direction nearly orthogonal to a movement direction of the displacement object. Accordingly, it is possible to be applied to a driving device for moving a displacement object within a passageway. Particularly, because a tensile force is utilized, stable displacement is available with the effect of the gravity reduced. Application is suited for a driving device for use on a precision instrument or a communication apparatus requiring stable operations regardless of the direction of transfer.

What is claimed is:

1. A driving device for moving a displacement object within a passageway, the device comprising:
   a surface-deforming element flexible to an applied voltage, to which the displacement object is integrally attached;
   at least one urging mechanism for applying a tensile force in a direction substantially orthogonal to a moving direction of the displacement object; and
   a plurality of holding mechanisms coupled to or integral with the urging mechanism wherein a tensile force to an outer periphery of the surface-deforming element is applied in a direction from an inner portion to an outer portion of the passageway.

2. A driving device according to claim 1, wherein the holding mechanism comprises a guide provided continuously along a moving direction of the displacement object at a tip of the urging mechanism, and an opening formed in a protrusion provided at the outer periphery of the surface-deforming element, thereby allowing the guide to slidably pass through in a direction of urging or tension applied by the urging means.

3. A driving device according to claim 1, wherein the holding mechanism comprises a guide provided continuously along a moving direction of the displacement object at a tip of the urging means, and an opening formed in a peripheral edge of the surface-deforming element allowing the guide to slidably pass through in a direction of urging or tension applied by the urging means.

4. A driving device according to claim 1, wherein the holding mechanism comprises a protrusion provided at the outer periphery of the surface-deforming element, and a guide in a rail form provided continuously along a moving direction of the displacement object at a tip of the urging mechanism, and formed with a groove, for engagement with the protrusion, along the moving direction of the displacement object.

5. A driving device according to claim 1, wherein the urging mechanism comprises a spring.

6. A driving device according to claim 1, wherein the holding mechanism serves also as the urging mechanism.

7. A driving device according to claim 1, wherein the holding mechanism is capable of suppressing a rotational motion of the displacement object about an axis in a moving direction thereof during a movement of the surface-deforming element.

8. A driving device according to claim 1, wherein the holding mechanism is configured to suppress a rotational motion of the displacement object about an axis in a direction orthogonal to a moving direction thereof during a movement of the surface-deforming element.

9. A driving device according to claim 1, wherein the surface-deforming element is a piezoelectric vibrator wherein a piezoelectric element having a lamination of a piezoelectric layer and an electrode layer is bonded at least to one of the surfaces of a vibration plate.

10. A driving device according to claim 9, wherein the holding mechanism includes a guide provided at a tip of the urging mechanism, continuously along a moving direction of the displacement object, and an opening formed in a protrusion provided at the outer periphery of the surface-deforming element, thereby allowing the guide to slidably pass through in a direction of urging or tension due to the urging means.

11. A driving device according to claim 9, wherein the holding mechanism includes a guide provided at a tip of the urging mechanism, continuously along a moving direction of the displacement object, and an opening formed in a peripheral edge of the surface-deforming element, thereby allowing the guide to slidably pass through in a direction of urging or tension applied by the urging means.

12. A driving device according to claim 9, wherein the holding mechanism includes a protrusion provided at the outer periphery of the surface-deforming element, and a guide in a rail form provided, at a tip of the urging mechanism, continuously along a moving direction of the displacement object and formed with a groove, for engagement with the protrusion, along the moving direction of the displacement object.

13. A driving device according to claim 9, wherein the urging mechanism comprises a spring.

14. A driving device according to claim 9, wherein the holding mechanism serves also as the urging mechanism.

15. A driving device according to claim 9, wherein the holding mechanism is configured to suppress a rotational motion of the displacement object about an axis in a moving direction thereof during a movement of the surface-deforming element.

16. A driving device according to claim 9, wherein the holding mechanism is configured to suppress a rotational motion of the displacement object about an axis in a direction orthogonal to a moving direction thereof during a movement of the surface-deforming element.

17. A driving device according to claim 1, wherein the urging mechanism comprises a load.

18. A driving device according to claim 9, wherein the urging mechanism comprises a load.

* * * * *